(12) United States Patent
Kim et al.

(10) Patent No.: US 7,718,542 B2
(45) Date of Patent: May 18, 2010

(54) LOW-K DAMAGE AVOIDANCE DURING BEVEL ETCH PROCESSING

(75) Inventors: Yunsang Kim, Monte Sereno, CA (US); Andrew Bailey, III, Pleasanton, CA (US); Jack Chen, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/510,309

(22) Filed: Aug. 25, 2006

(65) Prior Publication Data

US 2008/0050923 A1    Feb. 28, 2008

(51) Int. Cl.
 *H01L 21/302* (2006.01)
(52) U.S. Cl. .................. 438/725; 438/706; 438/73; 134/1.2
(58) Field of Classification Search ............ 438/706, 438/710, 712, 714, 720, 725, 731; 134/1.1, 134/1.2, 2, 3
See application file for complete search history.

(56) References Cited

U.S. PATENT DOCUMENTS

| 4,923,562 | A | 5/1990 | Jucha et al. |
| 4,923,828 | A * | 5/1990 | Gluck et al. ............. 134/1.2 |
| 6,004,631 | A | 12/1999 | Mori |
| 7,094,689 | B2 * | 8/2006 | Su et al. .................. 438/639 |
| 7,134,941 | B2 * | 11/2006 | Boumerzoug et al. ........ 451/39 |
| 2002/0081855 | A1 | 6/2002 | Jiang et al. |
| 2004/0137745 | A1 | 7/2004 | Houghton et al. |
| 2005/0011612 | A1 * | 1/2005 | Yakushiji et al. ........ 156/345.51 |
| 2005/0101125 | A1 | 5/2005 | Smith et al. |
| 2005/0178505 | A1 | 8/2005 | Kim |
| 2005/0263484 | A1 | 12/2005 | Park et al. |
| 2005/0284568 | A1 * | 12/2005 | America et al. ......... 156/345.5 |
| 2005/0284576 | A1 * | 12/2005 | America et al. ........ 156/345.43 |
| 2006/0000552 | A1 * | 1/2006 | Tanaka et al. ......... 156/345.28 |
| 2006/0051967 | A1 | 3/2006 | Chang et al. |
| 2006/0199370 | A1 * | 9/2006 | Dai et al. .................... 438/624 |

OTHER PUBLICATIONS

International Search Report dated Jan. 24, 2008 from PCT Application No. PCT/US2007/076444.
Written Opinion dated Jan. 24, 2008 from PCT Application No. PCT/US2007/076444.
U.S. Appl. No. 11/440,561 titled "Apparatus and Methods to Remove Films on Bevel Edge and Backside of Wafer", filed May 24, 2006.
U.S. Appl. No. 11/237,327 titled "Apparatus for the Removal of a Set of Byproducts From a Substrate Edge and Methods Therefor", filed Sep. 27, 2005.
U.S. Appl. No. 11/355,458 titled "Plasma Processing Reactor With Multiple Capacitive and Inductive Power Sources", filed Feb. 15, 2006.
U.S. Appl. No. 11/363,703 titled "Integrated Capacitive and Inductive Power Sources for a Plasma Etching Chamber", filed Feb. 27, 2006.

* cited by examiner

*Primary Examiner*—Lan Vinh
(74) *Attorney, Agent, or Firm*—Beyer Law Group LLP

(57) ABSTRACT

A method for etching a bevel edge of a substrate is provided. A patterned photoresist mask is formed over the etch layer. The bevel edge is cleaned comprising providing a cleaning gas comprising at least one of a $CO_2$, $CO$, $C_xH_y$, $H_2$, $NH_3$, $C_xH_yF_z$ and a combination thereof, forming a cleaning plasma from the cleaning gas, and exposing the bevel edge to the cleaning plasma. Features are etched into the etch layer through the photoresist features and the photoresist mask is removed.

31 Claims, 8 Drawing Sheets

LOW-K DAMAGE AVOIDANCE DURING BEVEL ETCH PROCESSING

FIELD OF INVENTION

The present invention relates to the formation of semiconductor devices. More particularly, the present invention relates to the removal of etch byproducts from a bevel edge during the formation of semiconductor devices. Even more particularly, the present invention relates to the avoidance of low-k damage in the removal of etch byproducts from a bevel edge during the formation of semiconductor devices.

BACKGROUND OF THE INVENTION

In the processing of a substrate, e.g., a semiconductor substrate or a glass panel such as one used in flat panel display manufacturing, plasma is often employed. During substrate processing, the substrate is divided into a plurality of dies, or rectangular areas. Each of the plurality of dies will become an integrated circuit. The substrate is then processed in a series of steps in which materials are selectively removed (or etched) and deposited. Control of the transistor gate critical dimension (CD) on the order of a few nanometers is a top priority, as each nanometer deviation from the target gate length may translate directly into the operational speed and/or operability of these devices.

Typically, a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (O), Nitrogen (N), Fluorine (F), etc., are often formed on the top and the bottom surfaces near a substrate edge (or bevel edge). Etch plasma density is normally lower near the edge of the substrate, which results in accumulation of polymer byproducts on the top and on the bottom surfaces of the substrate bevel edge. Typically, there are no dies present near the edge of the substrate, for example between about 5 mm to about 15 mm from the substrate edge. However, as successive byproduct polymer layers are deposited on the top and bottom surfaces of the bevel edge as a result of several different etch processes, organic bonds that are normally strong and adhesive will eventually weaken during subsequent processing steps. The polymer layers formed near the top and bottom surfaces of a substrate edge would then peel or flake off, often onto another substrate during post treatment, such as wet cleaning of the substrate surface, potentially affecting device yield.

Ultrafine feature sizes and high performance requirements have necessitated the integration of low-k dielectrics on semiconductor wafers that are mechanically weaker than previous generation materials. The inherently weaker nature of the low-k dielectric material can pose significant challenges to downstream electronic-packaging processes and materials.

Low-k materials are, by definition, those semiconductor-grade insulating materials that have a dielectric constant ("k") lower than 2.9. In order to further reduce the size of devices on integrated circuits, it has become necessary to use conductive materials having low resistivity and insulators having low-k to reduce the capacitive coupling between adjacent metal lines. Low-k dielectric, carbon, or fluorine-doped films are being integrated into back-end-of-line (BEOL) stacks to improve device performance and allow for device scaling.

However, low-k materials are porous, which introduces a host of process integration and materials compatibility difficulties. The balancing act between maintaining the film's integrity and integrating it properly and performing the necessary stripping, cleaning, and conditioning gets increasingly precarious. Patterning processes (etching, stripping, and cleaning) can also have a drastic impact on the integrity of the porous low-k. Current cleaning plasma gases used are $O_2$ and $CF_4$ or $N_2$ and $CF_4$, which results in the migration of nitrogen, oxygen, or fluorine radicals into the substrate. The migration causes the k value to increase, which changes the composition and degrades the materials.

Thus, low-k damage results in degraded device performance, reduced reliability, lost yield, and other related problems.

SUMMARY OF THE INVENTION

To achieve the foregoing and in accordance with the purpose of the present invention a method for etching a bevel edge of a substrate is provided. A patterned photoresist mask is formed over an etch layer. The bevel edge is cleaned comprising providing a cleaning gas comprising at least one of a $CO_2$, $CO$, $C_xH_y$, $H_2$, $NH_3$, $C_xH_yF_z$ or a combination thereof, forming a cleaning plasma from the cleaning gas, and exposing the bevel edge to the cleaning plasma. Features are etched into the etch layer through the photoresist features and the photoresist mask is removed.

Another manifestation of the invention provides for forming a patterned photoresist mask over an etch layer. Features are etched into the etch layer through the photoresist features and the photoresist mask is removed. The bevel edge is cleaned comprising providing a cleaning gas comprising at least one of a $CO_2$, $CO$, $C_xH_y$, $H_2$, $NH_3$, $C_xH_yF_z$ or a combination thereof, forming a cleaning plasma from the cleaning gas, and exposing the bevel edge to the cleaning plasma.

In another manifestation of the invention, an apparatus for etching a bevel edge of a substrate is provided. A plasma processing chamber, comprising a chamber wall forming a plasma processing chamber enclosure, a substrate support for supporting a substrate within the plasma processing chamber enclosure, wherein the substrate support has a diameter smaller than a diameter of the substrate, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure is provided. A gas source is in fluid connection with the gas inlet, where the gas source comprises a cleaning gas source, a cleaning plasma gas source, and an etch layer etch gas source. A controller is controllably connected to the gas source and the at least one electrode. The controller comprises at least one processor and computer readable media. The computer readable media comprises computer readable code for forming a patterned photoresist mask over an etch layer, computer readable code for cleaning the bevel edge comprising computer readable code for providing a cleaning gas comprising at least one of a $CO_2$, $CO$, $C_xH_y$, $H_2$, $NH_3$, $C_xH_yF_z$ or a combination thereof, computer readable code for forming a cleaning plasma from the cleaning gas, and computer readable code for exposing the bevel edge to the cleaning plasma. The computer readable media further comprises computer readable code for etching features into the etch layer through the photoresist features and computer readable code for removing the photoresist mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
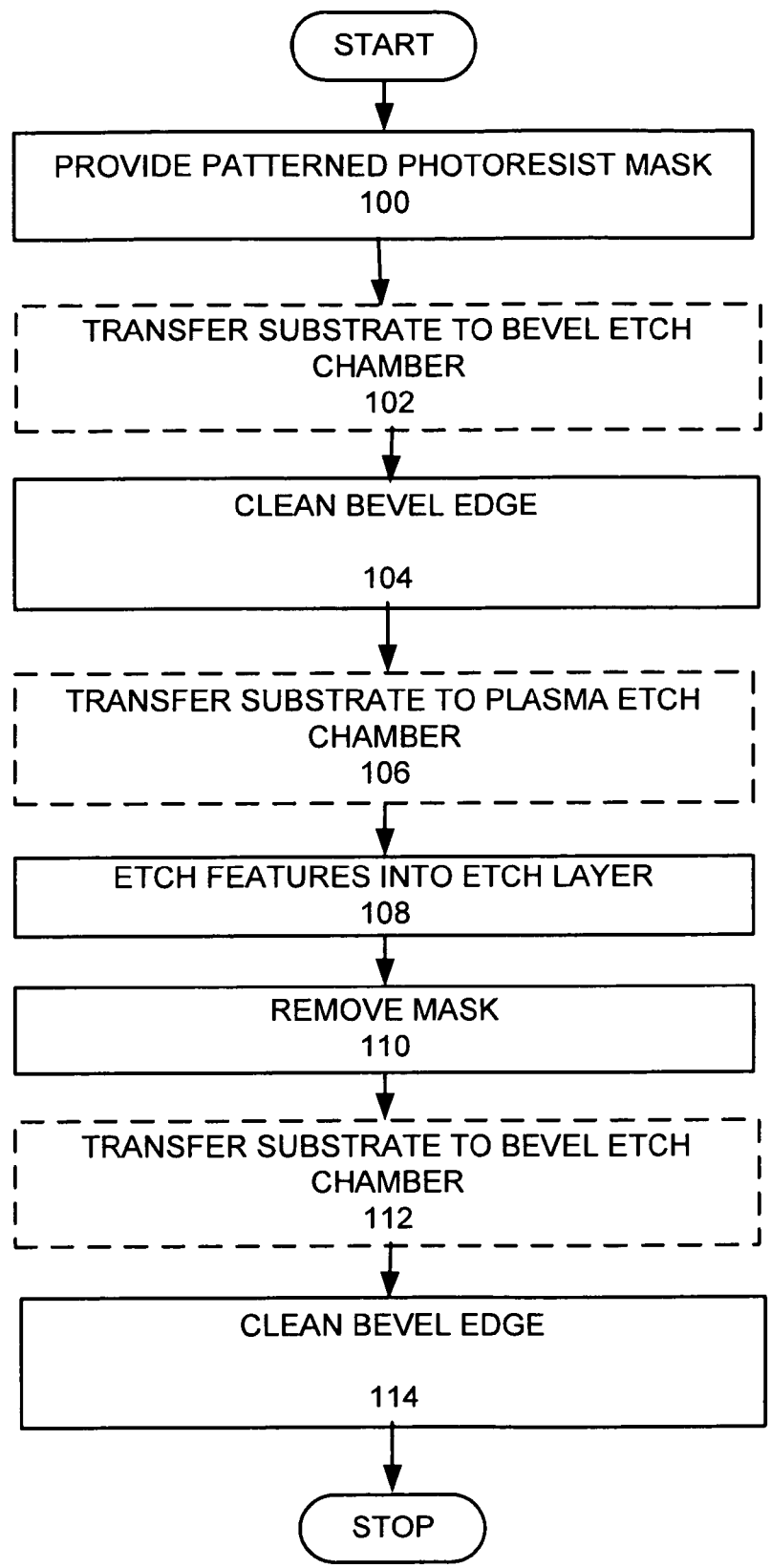
FIG. 1 is a high level flow chart of a process that may be used in an embodiment of the invention.
Figure 3A:
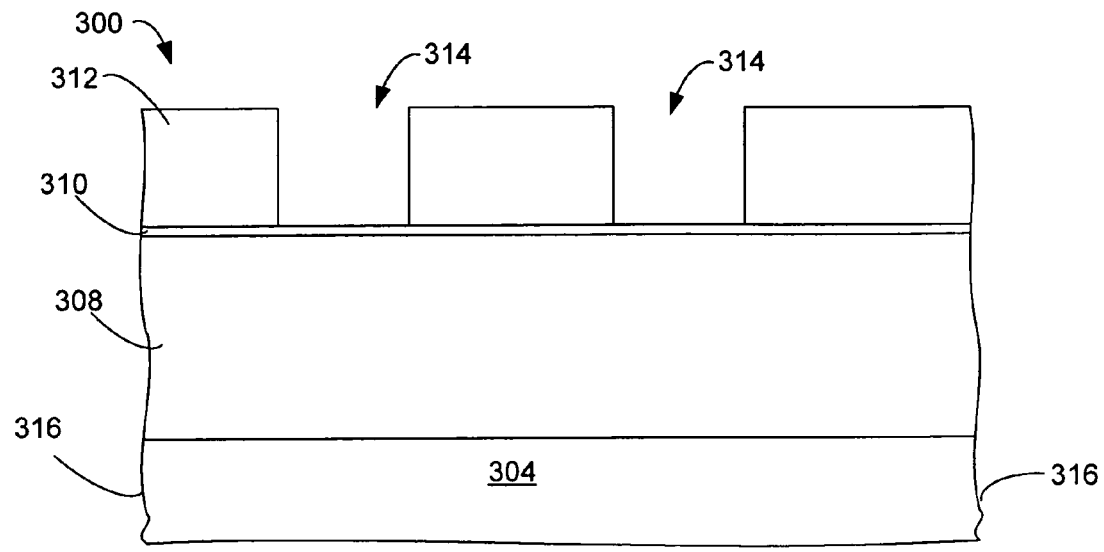
FIGS. 3A-C are schematic cross-sectional and top views of a stack processed according to an embodiment of the invention.

To facilitate understanding, FIG. 1 is a high level flow chart of a process that may be used in an embodiment of the invention. With reference to FIG. 1, a patterned photoresist mask is provided (step 100). FIG. 3A is a schematic cross-sectional view of a layer to be etched 308 over a substrate 304, with a patterned photoresist mask 312 with photoresist features 314, over an underlayer 310, over the layer 308 to be etched forming a stack 300. The photoresist mask has a photoresist feature critical dimension (CD), which may be the widest part of the width of the smallest possible feature. To provide the patterned photoresist mask, a photoresist layer may be first formed over the layer to be etched. Then the photoresist layer is patterned to form photoresist features 314.

Optionally, the substrate may be transferred to a bevel etch chamber (step 102). As described in detail below, one plasma chamber may be used to perform all the steps for forming the semiconductor. However, in an alternative embodiment, a separate chamber may be used to clean the bevel edge. Thus, the substrate must be transferred to the bevel etch chamber to clean the bevel edge.

Figure 4:
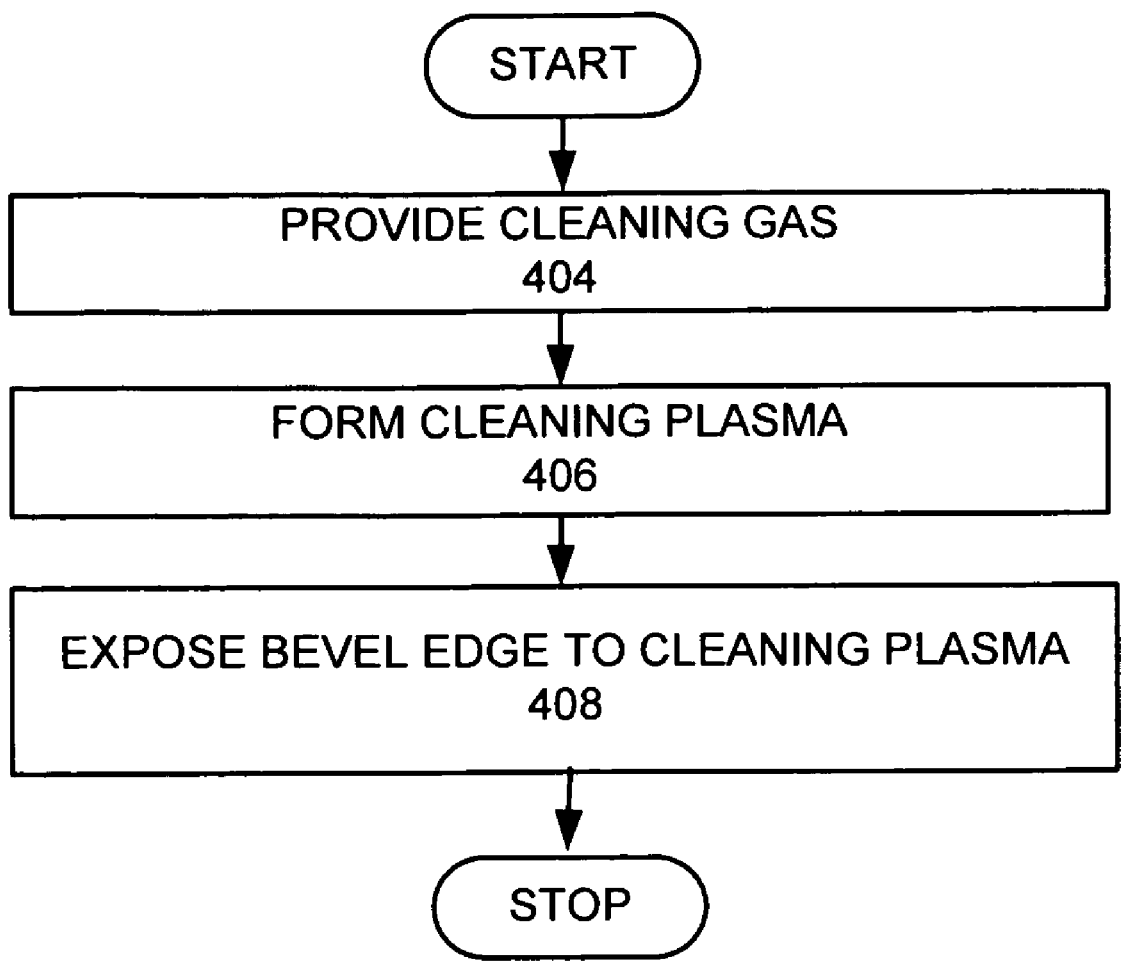
FIG. 4 is a more detailed flow chart of a step of cleaning the bevel edge.

The bevel edge may be cleaned (step 104). FIG. 4 is a more detailed flow chart of this step. As shown in FIG. 4, cleaning the bevel edge comprises the steps of providing a cleaning gas (step 404), forming a cleaning plasma (step 406), and exposing the bevel edge to the cleaning plasma (step 408). The cleaning gas may be $CO_2$, $CO$, $C_xH_y$, $H_2$, $NH_3$, $C_xH_yF_z$ or a combination thereof. Cleaning gas having a chemical formula $C_xH_y$ may be $CH_4$, $C_2H_6$, and $C_2H_4$. Cleaning gas having a chemical formula $C_xH_yF_z$ may be $CH_3F$, $CHF_3$, $CH_2F_2$, or $C_2H_2F_4$. The cleaning plasma may comprise $CO_2$, $CO$, $C_xH_y$, $H_2$, $NH_3$, $C_xH_yF_z$ or a combination thereof.

Not intended to be bound by any limitations or theories, it is believed that $CO$ or $CO_2$ works best followed by $C_xH_y$, $H_2$, $C_xH_yF_z$ and $NH_3$. Additionally, it is believed that $CO_2$ and $CF_4$ reduces the amount of oxygen and fluorine radicals. Thus, the use of $CO$ or $CO_2$ is most preferred. Use of $C_xH_y$ is next most preferred. Use $H_2$ is next most preferred. Use of $C_xH_yF_z$ is next preferred, and use of $NH_3$ is the next preferred.

Optionally, the substrate may be transferred back to a plasma etch chamber (step 106). As described in detail below, one plasma chamber may be used to perform all the steps for forming the semiconductor. However, in an alternative embodiment, a separate chamber may be used to etch the features in the etch layer. Thus, the substrate must be transferred to the plasma etch chamber to etch the features.

Figure 3B:
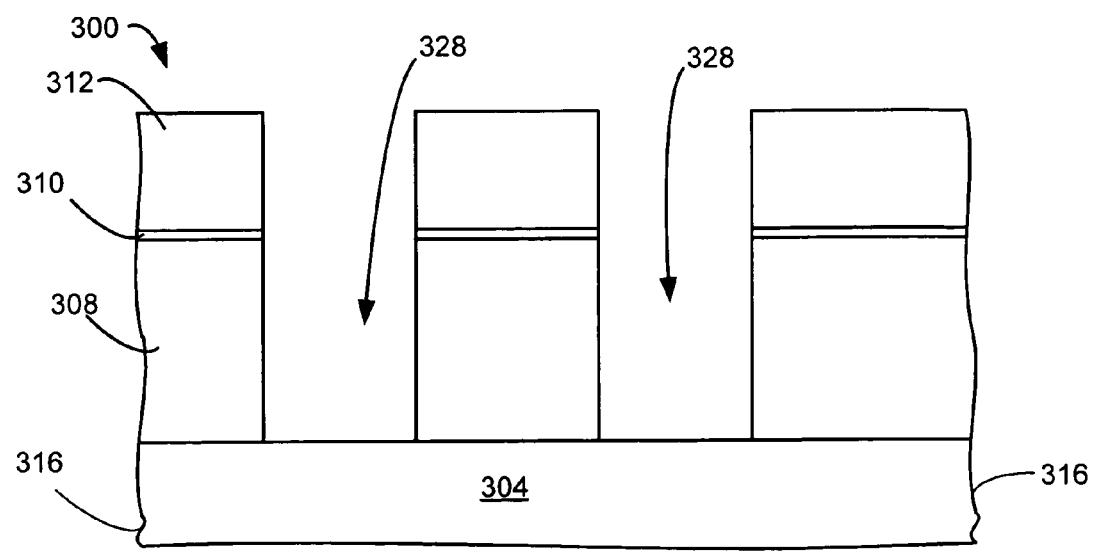
Figure 3C:
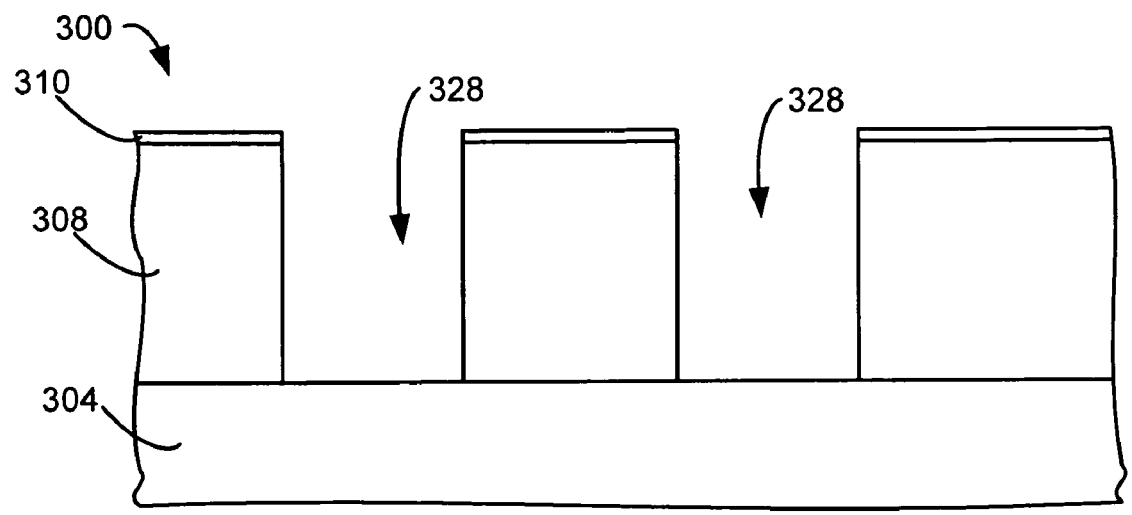

Features 328 are then etched into the etch layer 308 through the photoresist mask 312 (step 108), as shown in FIG. 3B. The photoresist mask 312 is then removed (step 110), as shown in FIG. 3C.

Optionally, the substrate may be transferred back a bevel etch chamber (step 112). The bevel edge may be cleaned again (step 114) as described above with reference to FIG. 4.

Figure 2:
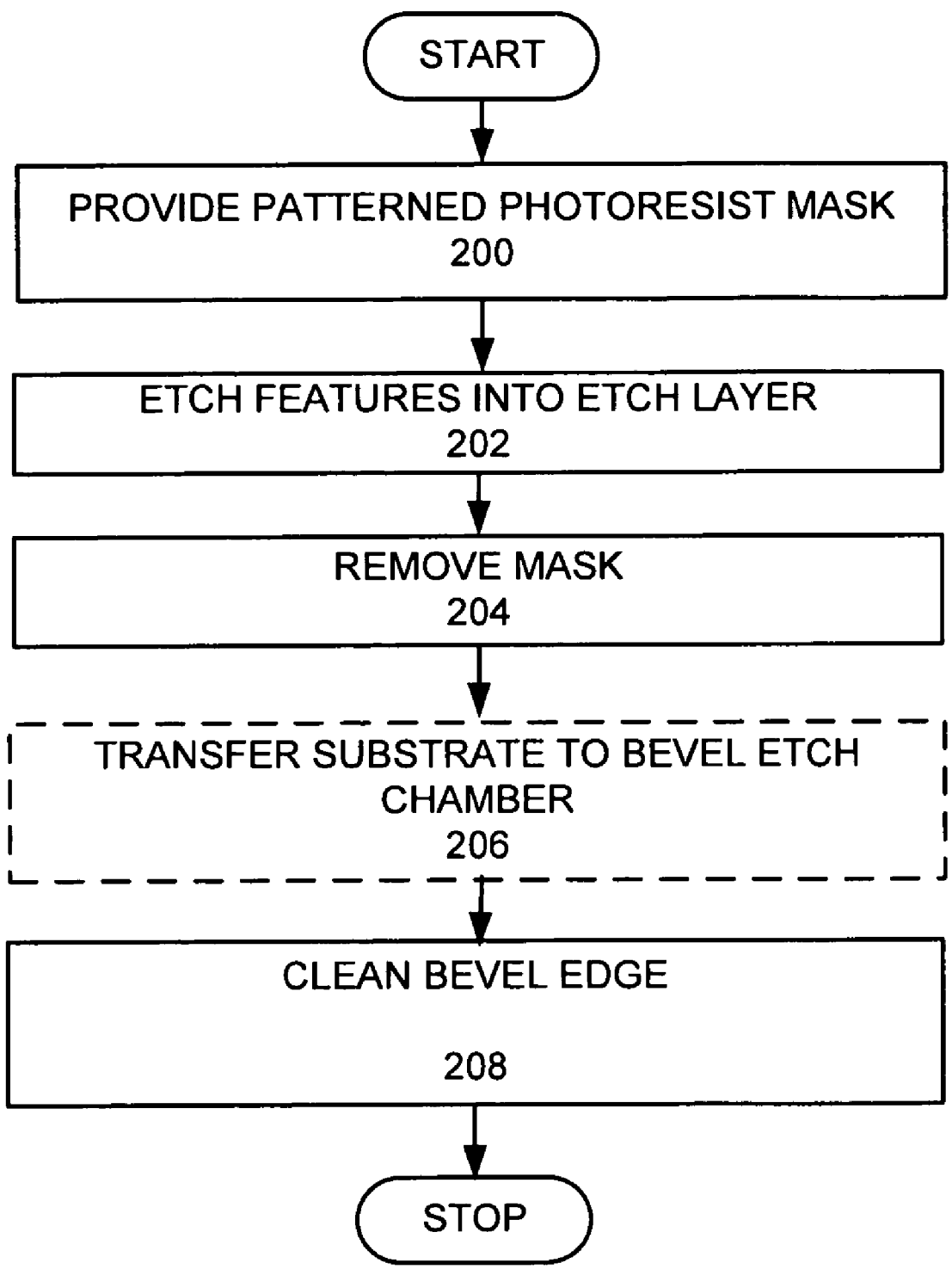
FIG. 2 is a high level flow chart of a process that may be used in another embodiment of the invention.

FIG. 2 is a high level flow chart of a process that may be used in another embodiment of the invention. A patterned photoresist mask is provided (step 200) as stated above with reference to FIG. 3A. Features 328 are then etched into the etch layer 308 through the photoresist mask 312 (step 202), as shown in FIG. 3B. The photoresist mask 312 is then removed (step 204), as shown in FIG. 3C.

Optionally, the substrate may be transferred to a bevel etch chamber (step 206). As described in detail below, one plasma chamber may be used to perform all the steps for forming the semiconductor. However, in an alternative embodiment, a separate chamber may be used to clean the bevel edge. Thus, the substrate must be transferred to the bevel etch chamber to clean the bevel edge.

The bevel edge may be cleaned (step 208). As shown in FIG. 4, cleaning the bevel edge comprises the steps of providing a cleaning gas (step 404), forming a cleaning plasma (step 406), and exposing the bevel edge to the cleaning plasma (step 408). The cleaning gas may be $CO_2$, $CO$, $C_xH_y$, $H_2$, $NH_3$, $C_xH_yF_z$ or a combination thereof. Cleaning gas having a chemical formula $C_xH_y$ may be $CH_4$, $C_2H_6$, and $C_2H_4$. Cleaning gas having a chemical formula $C_xH_yF_z$ may be $CH_3F$, $CHF_3$, $CH_2F_2$, or $C_2H_2F_4$. The cleaning plasma may comprise $CO_2$, $CO$, $C_xH_y$, $H_2$, $NH_3$, $C_xH_yF_z$ or a combination thereof.

Not intended to be bound by any limitations or theories, it is believed that $CO$ or $CO_2$ works best followed by $C_xH_y$, $H_2$, $C_xH_yF_z$ and $NH_3$. Additionally, it is believed that $CO_2$ and $CF_4$ reduces the amount of oxygen and fluorine radicals. Thus, the use of $CO$ or $CO_2$ is most preferred. Use of $C_xH_y$ is next most preferred. Use $H_2$ is next most preferred. Use of $C_xH_yF_z$ is next preferred, and use of $NH_3$ is the next preferred.

The underlayer 310 may be any known organic, inorganic, or metal layer. For exemplary purposes and not intended to be limiting, the underlayer may be an anti-reflective layer (ARL), bottom anti-reflective coating (BARC), dielectric anti-reflective coating (DARC), amorphorous carbon, or any other known underlayers.

EXAMPLE

In an example of this process, a patterned photoresist layer is formed (step 100, 200). A substrate 304, with the etch layer 308, an underlayer 310, a patterned photoresist mask 312, and a bevel edge 316 is placed in a plasma processing chamber.

Figures 5A, 5B:
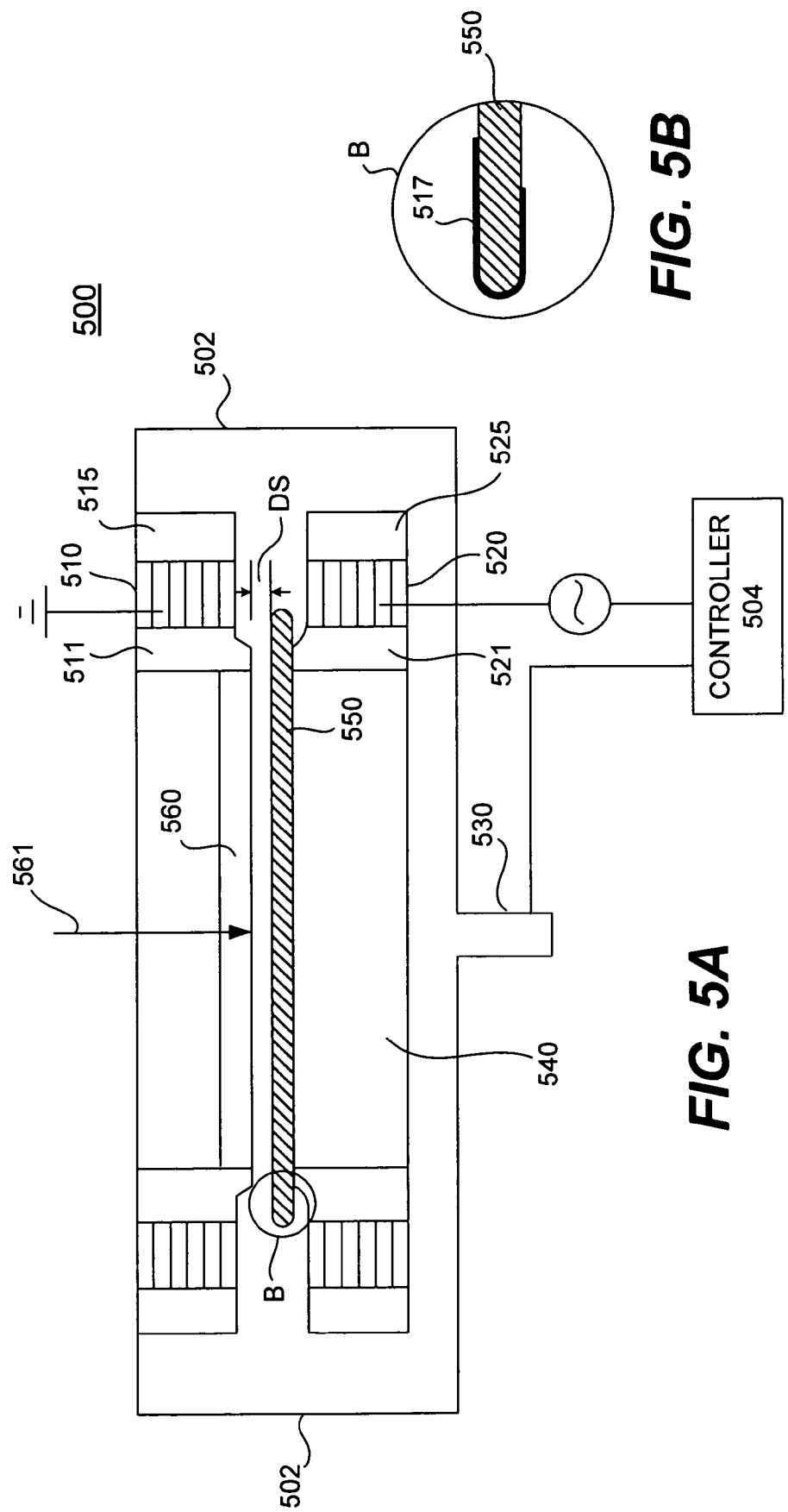
FIGS. 5A and 5B are schematic views of a bevel etch processing chamber that may be used in practicing the invention.

FIGS. 5A and 5B illustrate an embodiment of a bevel etch process chamber 500 enclosed by chamber walls 502. Chamber 500 has a substrate support 540 with a substrate 550 on top. In one embodiment, the substrate support 540 is an electrostatic chuck, which is powered by a RF (radio frequency) power source (not shown). The substrate support 540 can be DC (direct current), RF biased, or grounded. The substrate support 540 may have a diameter less than a diameter of the substrate 550 to allow for cleaning of the bevel edge. Opposing the substrate support 540 is a gas distribution plate 560 with a gas inlet 561. During etching of substrate 550, chamber 500 can be RF powered to generate capacitively coupled etch plasma or inductively coupled etch plasma.

The substrate 550 may have a bevel edge 517 that includes a top and a bottom surface of the edge of the substrate, as shown in region B of FIG. 5A and enlarged region B in FIG. 5B. In FIG. 5B, bevel edge 517 is highlighted as a bold solid line and curve.

Surrounding the edge of substrate support 540, there is a bottom edge electrode 520, made of conductive materials, such as aluminum (Al). Between the substrate support 540 and the bottom edge electrode 520, there is a bottom dielectric ring 521 electrically separating the substrate support 540 and the bottom edge electrode 520. In one embodiment, substrate 550 is not in contact with the bottom edge electrode 520. Beyond the bottom edge electrode 520, there is another bottom insulating ring 525, which extends the surface of the bottom edge electrode 520 facing substrate 550.

Surrounding the gas distribution plate 560, there is a top edge electrode 510, made of conductive materials, such as aluminum (Al). The top edge electrode 510 is electrically insulated from the gas distribution plate 560 by a top dielectric ring 511. Beyond the top edge electrode 510, there is top insulating ring 515, which extends the surface of the top edge electrode 510 facing substrate 550.

In one embodiment, the bottom edge electrode 520 is coupled to a RF power source 525 and the top edge electrode 510 is grounded. During a substrate bevel edge cleaning process, the RF power source 525 supplies RF power at a frequency between about 2 MHz to about 15 MHz and a power between about 100 watts to about 2000 watts to generate a cleaning plasma. During bevel edge cleaning the substrate support 540 and the gas distribution plate 560 are kept electrically floating. The cleaning plasma is configured to be confined by the top dielectric ring 511, top edge electrode 510, the top insulating ring 515, the bottom dielectric ring 521, the bottom edge electrode 520, and the bottom insulating ring.

The bevel etch chamber pressure may be between about 100 mTorr to about 2 Torr during the bevel edge cleaning process. The spacing between the gas distribution plate 560 and substrate 550, $D_S$, is less than 0.6 mm to ensure no plasma is formed between the top electrode 560 and the substrate 550 during the bevel edge cleaning process. The cleaning gas(es) may be supplied from any gas source (not shown) that is in fluid connection with gas inlet 561 and is exhausted from the chamber through a gas outlet by the exhaust pump 550. In one embodiment, the gas inlet is located near the center of the gas distribution plate 560. Alternatively, the cleaning gas(es) can also be supplied through gas inlet(s) disposed in other parts of the process chamber 500. A controller 504 is controllably connected to the RF sources 525, the gas source, and any other devices.

Other embodiments of the chamber are illustrated in U.S. patent application Ser. No. 11/440,561 filed May 24, 2006, entitled "Apparatus and Methods To Remove Films On Bevel Edge and Backside of Wafer", which is incorporated herein in its entirety for all purposes.

Figure 6A:
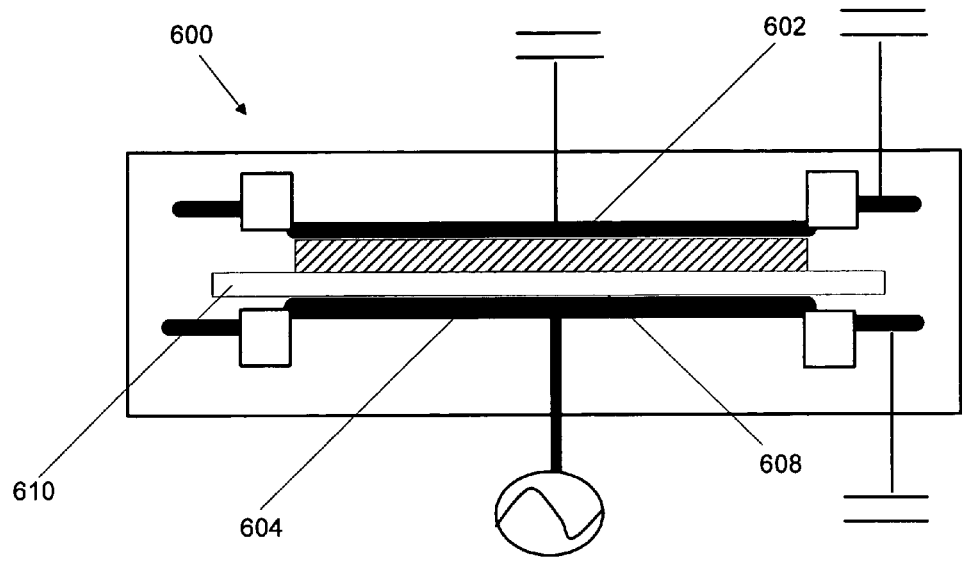
FIGS. 6A and 6B is a schematic view of an embodiment of a plasma processing chamber that may be used in practicing the invention.
Figure 6B:
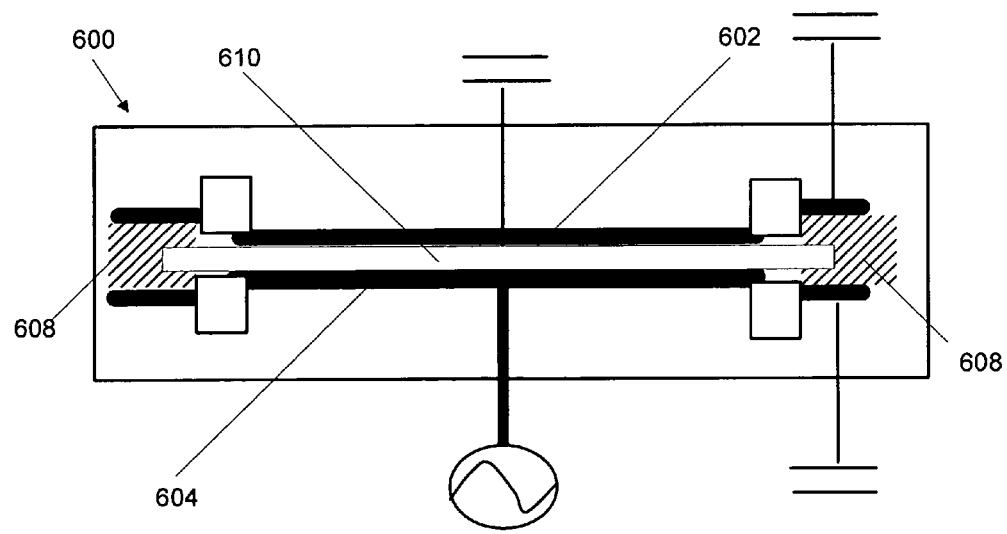

FIGS. 6A and 6B is a schematic view of an embodiment of a plasma processing chamber that may be used in practicing the invention. The plasma processing chamber 600 may clean and etch the substrate such that the substrate would not have to be transferred between chambers, thereby reducing process time, contamination, and other related issues. Since the plasma processing chamber 600 is similar to the chamber discussed with reference to FIG. 5, only the relevant elements will be discussed.

The processing chamber 600 may have a top electrode 602 and a bottom electrode 604. To facilitate the bevel etch, the diameter of the substrate 610 is greater than the diameter of the bottom electrode 604 which supports the substrate. The cleaning gas(es) may be supplied from any gas source that is in fluid connection with a gas inlet (illustrated in FIG. 5A). The cleaning gas(es) may be used to form cleaning plasma 608 between electrodes 602, 604. To clean the substrate, the electrodes 602, 604 may be moved toward each other thereby forcing the cleaning plasma 608 to the sides of the chamber 600 as illustrated in FIG. 6B. Therefore, the electrodes 602, 604 are closer together during the bevel etch than during the etch layer etch. Namely, the top electrode 602 and the bottom electrode 604 are separated during the etching process of the etch layer and are closer together during the etching process of the bevel edge. The bevel edges are cleaned by being exposed to the cleaning plasma 608.

Figure 7A:
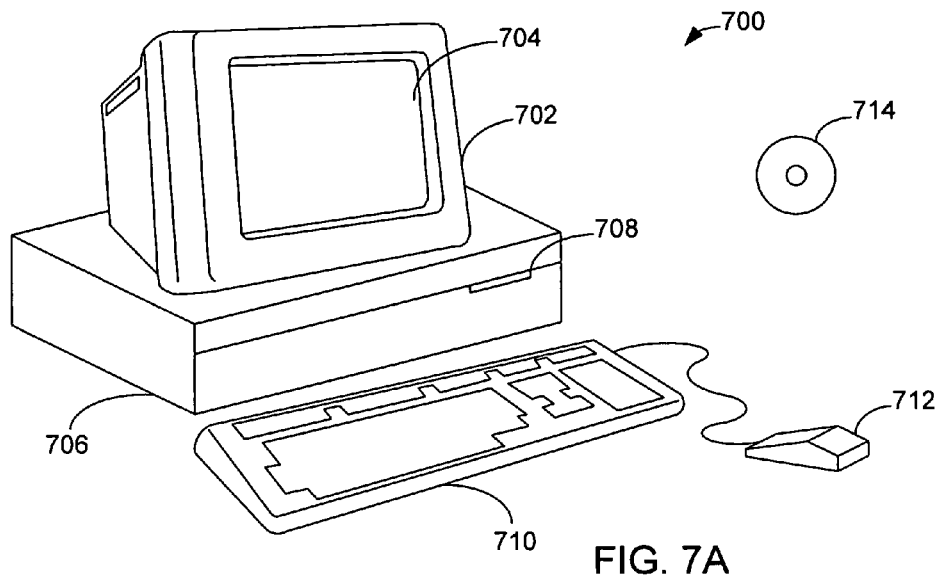
FIGS. 7A-B illustrate a computer system, which is suitable for implementing a controller used in embodiments of the present invention.
Figure 7B:
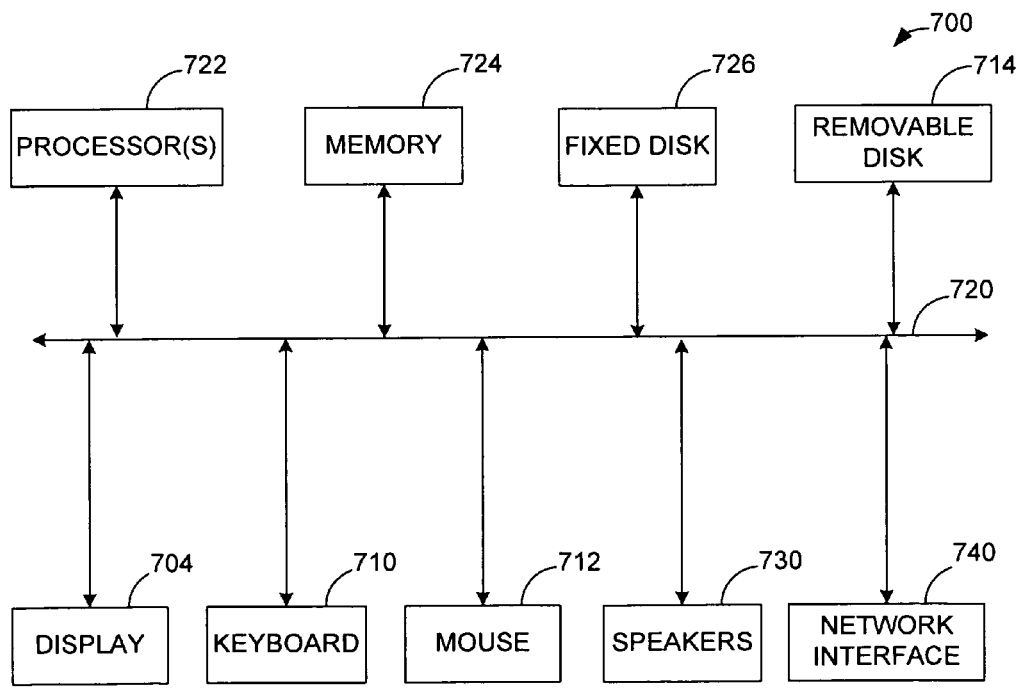

FIGS. 7A and 7B illustrate a computer system 700, which is suitable for implementing a controller 504 used in embodiments of the present invention. FIG. 7A shows one possible physical form of the computer system. Of course, the computer system may have many physical forms ranging from an integrated circuit, a printed circuit board, and a small handheld device up to a huge super computer. Computer system 700 includes a monitor 702, a display 704, a housing 706, a disk drive 708, a keyboard 710, and a mouse 712. Disk 714 is a computer-readable medium used to transfer data to and from computer system 700.

FIG. 7B is an example of a block diagram for computer system 700. Attached to system bus 720 is a wide variety of subsystems. Processor(s) 722 (also referred to as central processing units, or CPUs) are coupled to storage devices, including memory 724. Memory 724 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 726 is also coupled bi-directionally to CPU 722; it provides additional data storage capacity and may also include any of the computer-readable media described below. Fixed disk 726 may be used to store programs, data, and the like and is typically a secondary storage medium (such as a hard disk) that is slower than primary storage. It will be appreciated that the information retained within fixed disk 726 may, in appropriate cases, be incorporated in standard fashion as virtual memory in memory 724. Removable disk 714 may take the form of any of the computer-readable media described below.

CPU 722 is also coupled to a variety of input/output devices, such as display 704, keyboard 710, mouse 712, and speakers 730. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 722 optionally may be coupled to another computer or telecommunications network using network interface 740. With such a network interface, it is contemplated that the CPU might receive information from the network, or might output information to the network in the course of performing the above-described method steps. Furthermore, method embodiments of the present invention may execute solely upon CPU 722 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The bevel edge may be cleaned (step 104). With reference to the steps shown in FIG. 4, an example recipe of providing a cleaning gas (step 404) would use, for example, a gas of at least one of $CO_2$, CO, $C_xH_y$, $H_2$, $NH_3$, $C_xH_yF_z$ or a combination thereof from which a cleaning plasma may be formed (step 406). A plasma processing chamber may have a pressure of 500 mTorr-2 Torr. More preferably, the pressure for cleaning the bevel edge is between 100 mT-2 T. 100 to 2000 Watts of power are supplied to the plasma processing chamber at about 2-27 MHz. In one embodiment of a recipe, 5-1000 sccm of cleaning gas may be used at a temperature of 40° C. for longer than 5 seconds.

Features are then etched into the etch layer (step 108). An example of a layer to be etched is may be a conventional etch layer, such as SiN, SiC, an oxide, or low-k dielectric. A conventional etch recipe may be used to etch the layer to be etched.

To remove the mask (step 110) an oxygen ashing may be used.

In a preferred embodiment of the invention, the cleaning of the bevel edge and etching the features into the etch layer are done in situ in the same etch chamber, as illustrated in FIGS. 6A and 6B.

In another embodiment, features are etched into the etch layer (step 202). An example of a layer to be etched is may be a conventional etch layer, such as SiN, SiC, an oxide, or low-k dielectric. A conventional etch recipe may be used to etch the layer to be etched.

To remove the mask (step 204) an oxygen ashing may be used.

The bevel edge may be cleaned (step 208). With reference to the flow chart shown in FIG. 4, an example recipe of providing a cleaning gas (step 404) would use, for example, a gas of at least one of $CO_2$, CO, $C_xH_y$, $H_2$, $NH_3$, $C_xH_yF_z$ or a combination thereof from which a cleaning plasma may be formed (step 406). An etch chamber or plasma processing chamber may have a pressure of 500 mTorr-2 Torr. More preferably, the pressure for cleaning the bevel edge is between 100 mT-2 T. 100 to 2000 Watts of power are supplied to the plasma processing chamber at about 2-27 MHz. In one embodiment of a recipe, 5-1000 sccm of cleaning gas may be used at a temperature of 40° C. for longer than 5 seconds.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a bevel edge of a substrate, comprising:
    forming a patterned photoresist mask over an etch layer;
    etching features into the etch layer through the photoresist features;
    cleaning the bevel edge comprising:
        providing a cleaning gas comprising at least one of a $CO_2$ or CO;
        forming a cleaning plasma from the cleaning gas, including placing a gas distribution plate at a close distance from a top surface of the substrate such that the cleaning plasma is not formed between the gas distribution plate and the substrate during the bevel edge cleaning; and
        exposing the bevel edge to the cleaning plasma, the bevel edge exposed to the cleaning plasma including at least an edge portion of a top surface at an edge of the substrate; and
    removing the photoresist mask.

2. The method of claim 1, wherein the etching further comprises moving a gas distribution plate to a distance greater than 0.6 mm from the top surface of the substrate, and wherein the cleaning further comprises moving the gas distribution plate to a distance less than 0.6 mm from the top surface of the substrate.

3. The method of claim 1, wherein the cleaning plasma further comprises hydrocarbons.

4. The method of claim 1, wherein the cleaning plasma further comprises $H_2$.

5. The method of claim 1, further comprising:
    transferring the substrate to a bevel etch chamber; and
    performing the cleaning step before etching the features.

6. The method of claim 1, wherein the exposing the bevel edge further comprises flowing the cleaning plasma only from a gas distribution plate over the top surface of the substrate.

7. The method of claim 1, wherein the bevel edge exposed to the cleaning plasma further includes an edge portion of a bottom surface at the edge of the substrate.

8. The method of claim 1, wherein the cleaning the bevel edge further comprises:
keeping a substrate support and the gas distribution plate electrically floating during the bevel edge cleaning.

9. The method of claim 1, wherein forming the cleaning plasma further includes:
forming the cleaning plasma between a top edge electrode and a bottom edge electrode, the top edge electrode surrounding an edge of the gas distribution plate and the bottom edge electrode surrounding an edge of a substrate support.

10. The method of claim 1, wherein the cleaning occurs in a bevel etch chamber.

11. The method of claim 10, further comprising transferring the substrate to the bevel etch chamber.

12. The method of claim 11, wherein the etching further comprises transferring the substrate to a plasma processing chamber.

13. The method of claim 1, further comprising moving a top and bottom electrode used to form the cleaning plasma toward each other.

14. The method of claim 13, wherein the moving a top and bottom electrode toward each other comprises only moving the bottom electrode toward the top electrode.

15. The method of claim 13, wherein the moving a top and bottom electrode toward each other comprises only moving the top electrode toward the bottom electrode.

16. The method of claim 13, wherein the moving a top and bottom electrode toward each other forces the cleaning plasma to the sides of a chamber, thereby exposing the bevel edge to the cleaning plasma.

17. A method for etching a bevel edge of a substrate, comprising:
forming a patterned photoresist mask over an etch layer;
etching features into the etch layer through the photoresist features;
removing the photoresist mask;
cleaning the bevel edge after said removing the photoresist mask, comprising:
providing a cleaning gas comprising at least one of a $CO_2$ or CO;
forming a cleaning plasma from the cleaning gas; and
exposing the bevel edge to the cleaning plasma, the bevel edge exposed to the cleaning plasma including at least an edge portion of a top surface at an edge of the substrate.

18. The method of claim 17, wherein the etching further comprises moving a gas distribution plate to a distance greater than 0.6 mm from the top surface of the substrate, and wherein the cleaning further comprises moving the gas distribution plate to a distance less than 0.6 mm from the top surface of the substrate.

19. The method of claim 17, wherein the cleaning gas further comprises hydrocarbons.

20. The method of claim 17, wherein the cleaning plasma further comprises $H_2$.

21. The method of claim 17, wherein the exposing the bevel edge further comprises flowing the cleaning plasma only from a gas distribution plate over the top surface of the substrate.

22. The method of claim 17, wherein the bevel edge exposed to the cleaning plasma further includes an edge portion of a bottom surface at the edge of the substrate.

23. The method of claim 17, wherein the forming the cleaning plasma includes:
placing a gas distribution plate at a close distance from a top surface of the substrate such that the cleaning plasma is not formed between the gas distribution plate and the substrate during the bevel edge cleaning.

24. The method of claim 17, wherein the cleaning the bevel edge further comprises:
keeping a substrate support and the gas distribution plate electrically floating during the bevel edge cleaning.

25. The method of claim 17, wherein forming the cleaning plasma further includes:
forming the cleaning plasma between a top edge electrode and a bottom edge electrode, the top edge electrode surrounding an edge of the gas distribution plate and the bottom edge electrode surrounding an edge of a substrate support.

26. The method of claim 17 wherein the cleaning occurs in a bevel etch chamber.

27. The method of claim 26 further comprising transferring the substrate to the bevel etch chamber.

28. The method of claim 17, further comprising moving a top and bottom electrode used to form the cleaning plasma toward each other.

29. The method of claim 28, wherein the moving a top and bottom electrode toward each other comprises only moving the bottom electrode toward the top electrode.

30. The method of claim 28, wherein the moving a top and bottom electrode toward each other comprises only moving the top electrode toward the bottom electrode.

31. The method of claim 28, wherein the moving a top and bottom electrode toward each other forces the cleaning plasma to the sides of a chamber, thereby exposing the bevel edge to the cleaning plasma.

* * * * *